US008633705B2

(12) United States Patent
Hochwald et al.

(10) Patent No.: US 8,633,705 B2
(45) Date of Patent: *Jan. 21, 2014

(54) CHARACTERIZATION OF ELECTRICAL POWER DISTRIBUTION SYSTEMS

(71) Applicants: Bertrand M. Hochwald, South Bend, IN (US); Thomas L. Marzetta, Summit, NJ (US)

(72) Inventors: Bertrand M. Hochwald, South Bend, IN (US); Thomas L. Marzetta, Summit, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/844,991

(22) Filed: Mar. 17, 2013

(65) Prior Publication Data

US 2013/0214792 A1  Aug. 22, 2013

Related U.S. Application Data

(63) Continuation of application No. 12/885,883, filed on Sep. 20, 2010, now Pat. No. 8,427,169.

(51) Int. Cl.
*G01R 31/08* (2006.01)

(52) U.S. Cl.
USPC .......................................... 324/532; 324/527

(58) Field of Classification Search
USPC ............................................ 324/66, 527–534
See application file for complete search history.

(56) References Cited

U.S. PATENT DOCUMENTS

| 3,810,003 | A | 5/1974 | Portoulas |
| 5,278,512 | A | 1/1994 | Goldstein |
| 5,525,908 | A | 6/1996 | Brownell |
| 5,914,666 | A * | 6/1999 | Zingsheim et al. ............ 340/3.5 |
| 6,507,199 | B1 * | 1/2003 | Ahrndt et al. ................. 324/533 |
| 7,808,226 | B1 | 10/2010 | Barsumian et al. |
| 2003/0085715 | A1 | 5/2003 | Lubkeman |
| 2010/0013498 | A1 * | 1/2010 | Olguin .......................... 324/649 |

* cited by examiner

*Primary Examiner* — Vincent Q Nguyen
(74) *Attorney, Agent, or Firm* — Brian R. Short

(57) ABSTRACT

Embodiments of methods and apparatuses for characterizing an electrical power distribution system are disclosed. One method includes applying, by at least one test/response unit, at least one test signal to at least one test point of the system, measuring, by a plurality of test/response units, a plurality of response signals at a plurality of test points, wherein the plurality of response signals are generated in response to the at least one test signal, and characterizing the system based on the plurality of response signals.

20 Claims, 6 Drawing Sheets

```
┌─────────────────────────────────────────────────────────────────────────────┐
│ Applying a plurality of test signals (as opposed to applying a single test  │
│ signal) to a plurality of test points of the system                         │
│                                                                             │
│                                    610                                      │
└─────────────────────────────────────────────────────────────────────────────┘
                                     │
                                     ▼
┌─────────────────────────────────────────────────────────────────────────────┐
│ Measuring a response signal at one or more test points, wherein the         │
│ response signals are generated in response to the plurality of test signals.│
│                                                                             │
│                                    620                                      │
└─────────────────────────────────────────────────────────────────────────────┘
                                     │
                                     ▼
┌─────────────────────────────────────────────────────────────────────────────┐
│      Characterizing the system based on the at least one response signal    │
│                                                                             │
│                                    630                                      │
└─────────────────────────────────────────────────────────────────────────────┘
```

FIGURE 6

CHARACTERIZATION OF ELECTRICAL POWER DISTRIBUTION SYSTEMS

RELATED APPLICATIONS

This patent application is a continuation of U.S. patent application Ser. No. 12/885,883, filed Sep. 20, 2010, which is herein incorporated by reference.

FIELD OF THE DESCRIBED EMBODIMENTS

The described embodiments relate generally to electrical system testing. More specifically, the described embodiments relate to methods and apparatuses for characterization of electrical power distribution systems.

BACKGROUND

An electrical power distribution system or premises wiring of a building or structure whose wiring is generally inaccessible for visual inspection and for which only limited blueprint information may be available can be very difficult to characterize. The system is normally used to distribute power from a centralized feed through a distribution panel and branch circuits to various locations within the structure that require a source of electricity. Such locations might include dedicated circuits for motors, ventilation, heating, cooling, lighting, safety-systems, alarms, or general purpose outlets. Electrical systems usually comprise voltage sources, often connected through a service panel, and protected against overload by circuit breakers and fuses, distributed along branch circuits by a variety of wiring and junction boxes, conduits, and raceways. Such wiring and boxes are often contained within the structure within walls, floors, or ceilings of buildings, hidden from view and difficult to access without intrusive and potentially destructive methods.

There are a variety of voltages, currents, and multi-phase circuits possible for common industrial, commercial, and residential power distribution systems. Each such circuit may be divided and further subdivided in the form of branch circuits that travel throughout a commercial building or dwelling. Characterizing these branch circuits is key for determining whether the electrical system is functional and safe.

As buildings age, the condition of the wiring deteriorates because of normal aging, infiltration of elements, action by vermin, sub-standard modifications that do not meet current electrical codes, or abuse or overloading, or incorrect installation. It would be desirable to characterize the electrical system condition without invasive or destructive tests, and without endangering the personnel making such tests. Furthermore, such characterization should not contribute to any deterioration of the condition of the system.

There is a need to be able to easily characterize an electrical power distribution system or premises wiring of a building or structure whose wiring is generally inaccessible for visual inspection and for which only limited blueprint information may be available.

SUMMARY OF THE DESCRIBED EMBODIMENTS

An embodiment includes a method of characterizing an electrical power distribution system. The method includes applying, by at least one test/response unit, at least one test signal to at least one test point of the system, measuring, by a plurality of test/response units, a plurality of response signals at a plurality of test points, wherein the plurality of response signals are generated in response to the at least one test signal, and characterizing the system based on the plurality of response signals.

Another embodiment includes a system for characterizing an electrical power distribution system. The system includes a plurality of test/response units attached to a plurality of test points, said units configured to, at least one of, generate test signals or measure response signals at the plurality of test points. The system further includes at least one controller coordinating application of test signals and characterizing the electrical power distribution system based on the response signals, and a communications link between the plurality of test/response units allowing the plurality of test/response units to communicate with the at least one controller.

Another embodiment includes a test/response unit that is connectable to an electrical power distribution system through a test point. For this embodiment, the unit is operative to apply at least one test signal to the test point, measure at least one response signal at the test point, and receive instructions on application of the test signal from, or transmit the results of its measured response signal to, another test/response unit or coordinating controller.

Other aspects and advantages of the described embodiments will become apparent from the following detailed description, taken in conjunction with the accompanying drawings, illustrating by way of example the principles of the described embodiments.

BRIEF DESCRIPTION OF THE DRAWINGS

FIG. 6 is a flow chart that includes steps of another example of a method of characterizing an electrical power distribution system.

DETAILED DESCRIPTION

The described embodiments provide non-invasive characterization of electrical power distribution systems. The described embodiments are operable, for example, for characterizing premises wiring of a building or structure wherein the wiring is inaccessible for visual inspection, and for which only limited blueprint information may be available.

The embodiments for characterizing and testing of electrical power distribution systems are simple and economical that they can be done as desired or deemed necessary. For example, if it is noticed by the inhabitants of the structure that there are circuits that are inoperable, excessively hot, sparking or arcing, or exposed, then such characterization and tests can be used to help determine the cause. As another example, during the buying or selling of a structure, or other exchange of ownership, the new owners or inhabitants might want such testing as a clause of the transaction.

There are known methods for testing individual electrical circuits. Such methods include testing probes that measure voltage at particular outlets or other test points to ensure that wiring to that outlet is intact and proper. Such methods are generally confined to measuring the response at the test point to which the test signal is applied. The embodiments described herein differ in many aspects including applying the test signal at one or more test points and measuring the response at a plurality of test points. Furthermore, the measurements at the plurality of test points can be processed analytically to deduce individual circuit characteristics that cannot be deduced by measuring at individual test points alone.

Figure 1:
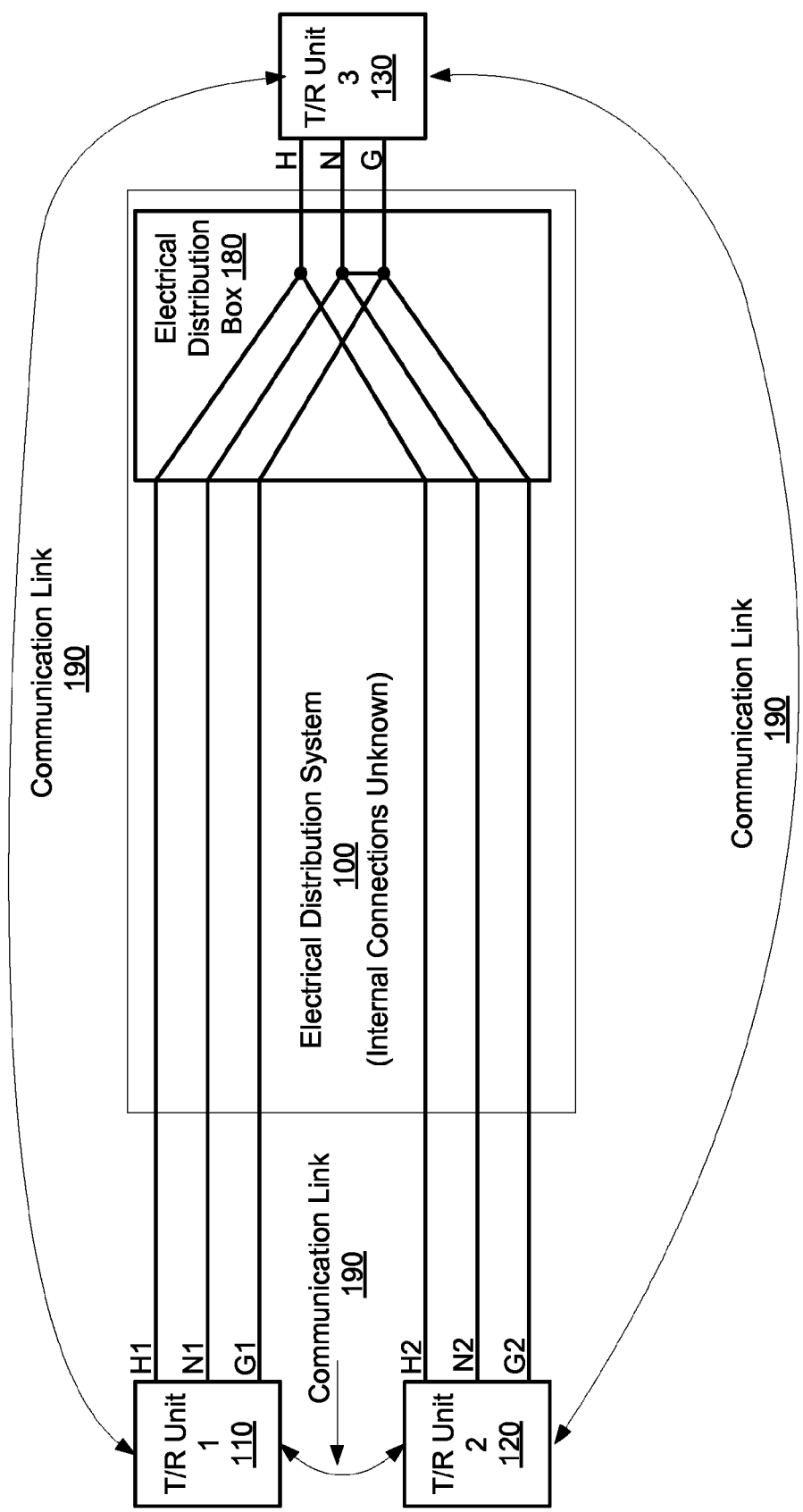
FIG. 1 shows an example of an electrical distribution system, and multiple test/response units for testing/characterizing the electrical distribution system.

FIG. 1 shows an example of an electrical distribution system 100, and multiple test/response (T/R) units 110, 120, 130 for testing/characterizing the electrical distribution system. As shown, the T/R units 110, 120, 130 are electrically connected to the electrical distribution system 100 at various points (to be referred to as "test points") or locations of the electrical distribution system 100. Additionally, communication links 190 are established between the multiple T/R units 110, 120, 130 allowing the multiple T/R units 110, 120, 130 to communicate information about test signals applied to the test points, and information about response signals measured at the test points.

As will be described, the communication links 190 between the multiple T/R units 110, 120, 130 allow for coordinated application of test signals at one or more test points, and coordinated measurements of the responses at one or more test points. This coordination allows for more complete characterization of electrical distribution systems than available by single test point testing and characterization. For an embodiment, each of the test points includes at least one electrical contact or accessible wire around which may be placed a current-probe. A current-probe allows current measurements to be made without breaking the insulation of a wire.

As will be described, a test point can include multiple electrical conductors. Further, test signals can be applied between pairs of electrical contacts at a test point. A test point generally means any location that is accessible to service personnel and connected to the electrical system of the structure. Such test points may include standard electrical outlets with receptacles normally used to connect appliances, or devices and switches used for control or lighting, or lighting outlets, or connection points at or within panel boxes. Such points are normally found mounted on or partially within a wall, ceiling or floor. These test points are particularly suited for making measurements that allow the condition of an electrical system to be ascertained.

For an embodiment, characterizing the electrical power distribution system based on the plurality of response signals includes deducing electrical properties of the individual branches of the electrical power distribution system. For another embodiment, characterizing the electrical power distribution system based on the plurality of response signals includes locating at least one fault within the system. Embodiments include observing response-signals for time-variations to indicate time-varying effects.

For the purposes of description here, the term "characterization" includes determining the electrical properties of the individual circuit conductors within branch circuits of the electrical power distribution system. Such properties include resistances of conductors and junctions. Characteristics of a conductor in good condition include low resistance. For example, 14 AWG copper wire has a normal resistance at room temperature of 0.0025 ohms/foot. Any characterization of resistance more than this amount, might indicate a problem within the wire, or at a junction in which the wire is joined to other wires. Other forms of characterizations of an electrical distribution system include determining the number of branch circuits, the number of outlets on a given branch circuit, identifying which outlets are connected to which branch circuit, and the detection of branch circuits that have ground-fault or arc-fault protection. The number of outlets, and use of ground-fault protection is generally governed by local electrical codes.

One embodiment of a "blueprint" of the electrical distribution system includes associating the branch outlets and branch loads with the branch circuits. Such an embodiment allows the wiring diagram of the dwelling or structure to be constructed and evaluated.

The term "characterization" can also include identifying if the electrical power distribution system has any deficiencies that are shock-hazards, fire-hazards, code violations, or other defects that are not easily determined in systems that cannot be easily accessed or visually inspected.

One outcome of the characterization process would include a determination of whether the system can perform its intended function safely and in the manner it was designed. Another outcome would include a determination of whether there are any design deficiencies, or if the blueprint contains code violations.

For the purposes of discussion here, the term "condition" means the following: A system in "good" condition can supply the rated loads to the circuits being tested without presenting a fire danger. Such a system can be considered safe to use in the method for which it is rated. A system in "fair" condition can supply the rated loads, but might have code violations or wiring deficiencies that need attention. Such a system might need repair, but can still be used without near-term hazard. A system in "poor" condition has one or more faults that are shock or fire hazards, or prohibit the rated load from being delivered to one or more outlets or test points. A system in "poor" condition would normally not be used until it is repaired. It should be de-energized.

For the purposes of discussion here, the term "fault" includes any condition that presents a potential health, shock, or fire hazard or violation of generally accepted safe construction or wiring practices. A fault may include improper modifications to, or be the result of deterioration to, a properly designed system. Other faults may be the result of changes to design, codes, and construction practices. Systems designed in a given year according to generally accepted safe practices may, even in the absence of significant deterioration, have faults of design, wiring, or construction that are identified in subsequent years as a result of changing practices or codes.

An example of a fault that is a potential fire hazard is the use of wiring that does not have the ampacity to supply the load rating for a fuse or circuit-breaker in its path. This is a fault of design or construction.

Another example of a fault includes sharing the main branch circuit for a bathroom in a business or residence as the supply for other rooms. Another example is omitting ground-fault protection in the main branch circuit for a kitchen or bathroom. These are examples of faults that may be the result of changes in generally accepted codes, since residences built prior to certain years were not required to have ground fault protection.

Another example of a fault includes a point of high resistance in a junction box because of deterioration of a junction contained in the box. Another example is a point or area of high resistance in an inaccessible location that is the result of action by vermin or weather. These two examples are faults due to deterioration of what was formerly a safe electrical system. Points of high resistance are widely recognized as fire hazards. For embodiments, characterizing the power distribution system includes determining if there is a fault at one location or more than one location.

Another example of a fault includes excessive temperature, which may result from improper bundling or routing of wiring or cables or the use of wiring that cannot supply sufficient load. Such a fault would not necessarily be obvious by inspection since electrical codes can only supply guidelines for routing and cannot cover all circumstances.

As described, the test signals can be applied to at least one test point and a plurality of responses to the test signal observed. A test signal can be active or passive.

A passive test signal has the property that it is a resistive or reactive load. Generally, a passive test signal would be applied to circuits that are energized by some other means such as through its normal connection to the service panel. One example of a response signal that is measured during the application of a passive test signal could be any change in voltage of the already-energized circuit as the passive test signal is applied.

An active test signal has the property that it supplies its own source of power, for example, an injected current. An active test signal has the advantage that it may be used in circuits that are not energized.

The application of a test signal can include application of passive resistive or reactive load or active injection of voltage or current signal. By applying a test signal in the form of a known calibrated load to an outlet of known voltage, the electrical current can be measured to determine if the branch circuit conductors connected to the outlet are able to supply the necessary power to the circuit. The injection of a voltage or current test signal is sometimes used to look for breakages in electrical networks, where the reflection of the signal from this breakage is used to determine the approximate location and severity of the break.

A "response-signal" at a test point may constitute any of voltage, current, temperature, resistance, conductance, impedance, inductance, or capacitance, or similar physical attribute associated with an electrical system or network. The instrument measuring the response signal should not influence the circuit appreciably by drawing significant current or being a significant load. It is to be understood that a response signal may be measured with or without application of a test signal generated by a T/R unit. It is often the case that the difference in the response signal before application and during application of a test signal by a T/R unit is of significance, especially on a power distribution system that is live (is powered by external means). An example of a response signal that can be made without a test signal generated by a T/R unit includes voltage measurements between contacts at a test point in a live circuit. In this case, the line voltage already supplied in the live circuit acts as a test signal not supplied by a T/R unit. Similarly, a plurality of T/R units may make measurements of voltages at a plurality of test points with no test signal generated by a T/R unit. Such measurements of response signals without having the T/R unit generate test signals establish a "baseline" which is used in the characterization of the electrical circuit.

After the baseline is established, a T/R unit may supply a resistive load at a test point as an example of a T/R unit generated test signal. During the application of this load, a plurality of T/R units may make measurements of the response signals. The differences in response signals (in this example, voltage differences between baseline and application of the resistive load) may be used to characterize the electrical power distribution system.

If the power distribution system is not live at the time of testing, a T/R unit may apply a test signal that supplies voltage to the circuit so that all T/R units may establish a baseline. Such a test signal used for establishing a baseline is called a "baseline signal." If the circuit is live at the time of testing, the signal already present may be called the "baseline signal". The response measured by a T/R unit to a baseline signal is called a "baseline measurement." Hence, a baseline measurement may be made with or without a T/R unit supplying the baseline signal.

Figure 2A:
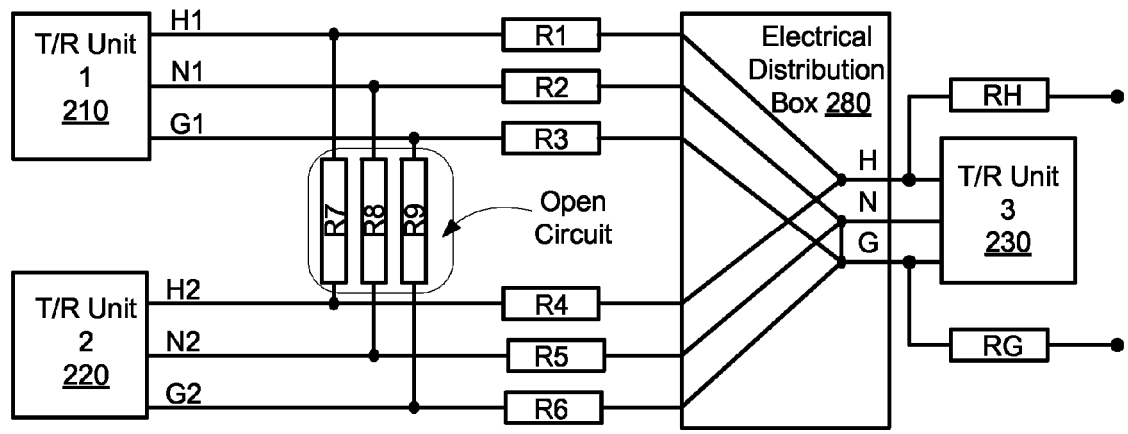
FIGS. 2A, 2B show exemplary configurations of electrical distribution systems that can be characterized using the described embodiments.
Figure 2B:
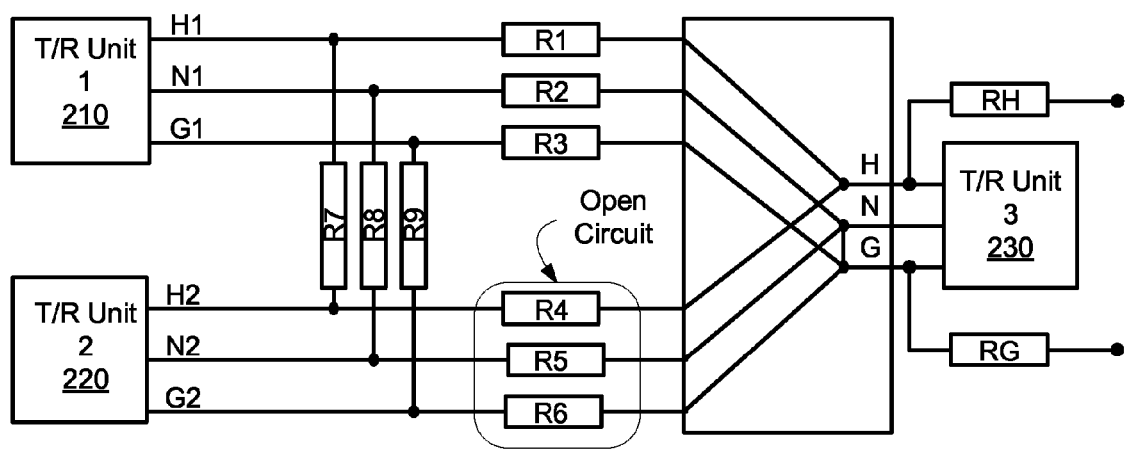

FIGS. 2A and 2B show exemplary configurations of electrical distribution systems that can be characterized using the described embodiments. The two figures show a service panel and two test points (in this example, power outlets) having configurations that differ in the way that the power outlets are electrically connected to the service panel. Both configurations are generally allowable according to commonly-accepted electrical codes and are functionally equivalent to the user connecting to the system. However, to a person characterizing and testing the system, they are different. But all that is generally accessible are the two outlets and the service panel. It is not generally obvious which configuration applies since the wiring is not necessarily accessible for observation.

It is assumed that a characterization is required, and part of this characterization is to determine whether the model of FIG. 2A or 2B applies, and if there are one or more faults in the distribution system.

It is readily apparent that two outlets may be connected in many other ways as part of a larger power distribution system. To limit the scope of the discussion, only the possible configurations in FIGS. 2A and 2B are considered.

The resistive paths R1-R9 model the presence or absence of wires. Low resistance models a wire that is present and in good condition, and high resistance models a wire that is absent or in poor condition. The difference in the two figures lies in which wires are present. As shown, the resistive paths R7, R8, R9 of FIG. 2A are high-resistance, indicating absence of those paths, while R4, R5, R6 are high-resistance in FIG. 2B.

The resistive paths RH and RG represent resistance between the Electrical Distribution Box (280) and the external electrical service supplying the distribution box.

The described embodiments can be used to characterize the power distribution system. This characterization is now described in more detail. It is assumed that the circuit is live at the time of testing.

As part of the characterization, the T/R units 1, 2, and 3 establish a baseline of voltage measurements at the three test points before the application of any T/R-generated test signal. Application of test signals by one or more of the T/R units 210, 220, 230 and measurements of responses at each of the T/R units 210, 220, 230 can then deduce where the high-resistance (and low-resistance) paths are located. The response signals of the electrical distribution system of FIG. 2A differ from the response signals of the electrical distribution system of FIG. 2B. A detailed description follows.

It is important to note that even if only one T/R unit is applying a test signal, it is the measuring of a plurality of response signals with a plurality of T/R units that enables the controller to ascertain which configuration applies.

In one stage of the characterization, T/R units 1, 2, and 3 are all instructed to measure their respective H–N voltage as a response signal, using the fact that the circuit is live and therefore has a test signal readily available. This establishes the baseline.

In another stage of the characterization, T/R unit 1 is instructed by the controller to apply a test signal that is a known resistive load between H1 and N1, at which points T/R units 1, 2, and 3, are all instructed to measure their respective response-signals that includes the voltages between their respective H and N contacts.

In the case of the power distribution system depicted in FIG. 2A, T/R unit 2 shows that the H2–N2 voltage is substantially the same as the H–N voltage measured by T/R unit 3. Furthermore, the H1–N1 voltage is lower than H2–N2 (or H–N). The amount that it is lower is determined by R1 and R2 and the size of the applied resistive load and current that is drawn.

However, this same test procedure applied to FIG. 2B results in the T/R unit 2 showing substantially the same H2–N2 voltage as H1–N1, and both are lower than the H–N voltage measured by T/R unit 3.

In another stage of the characterization, a resistive load from H2 to N2 at T/R unit 2 is applied, and H–N voltage measurements taken at all three test units. Further information about the configuration and actual resistance values are thereby obtained, depending on the relative values of H–N, H1–N1, and H2–N2 voltage. It should be noted that the order of where test signals are applied is generally not unique, nor are the variety of response-signals that may be measured. It is, however, important that response signals are measured at a plurality of test points in response to each test signal.

At the conclusion of the test procedure, the response signals measured by all T/R units are collated by a controller. The controller then may characterize the system, decide the configuration and the presence or absence of any faults.

Some exemplary calculations are:

1) A baseline measurement of response signals is made by all three T/R units before any test signals are applied. In this case it is assumed that there is an active electrical distribution voltage present and that the T/R units may utilize this voltage during its characterization. The voltages should obey $$V_{HN}^{(B)} = V_{H1N1}^{(B)} = V_{H2N2}^{(B)}$$

where the superscript "(B)" means that it is a baseline measurement, and the subscript "HN" represents that T/R unit 3 is measuring the voltage between "H" and "N" (or Hot and Neutral), and similarly, for H1N1 and H2N2. Any significant deviation from these values indicates that there are wiring problems or unanticipated loads active on the circuit.

2) Then, T/R unit 1 applies a resistive load $R_L$ between H1 and N1. The following equations apply:

$$R_H + R_G = \frac{V_{HN}^{(B)} - V_{HN}^{(1)}}{I_{H1N1}^{(1)}}$$

where the superscript "(1)" indicates that this is the first non-baseline test/response measurement being made. It is assumed that voltage (V) and current (I) response signal measurements are available at the T/R units. Large values for $R_H + R_G$ indicate a fault between the electrical distribution box and the external service. Other equations that apply include:

$$V_{H2N2}^{(1)} = V_{HN}^{(1)} - V_{HH1}^{(1)} \frac{R_4}{R_4 + R_7} - V_{N1N}^{(1)} \frac{R_5}{R_5 + R_8} \text{ and}$$

-continued $$V_{H1N1}^{(1)} = \frac{R_L V_{HN}^{(1)}}{R_L + \frac{R_1(R_4 + R_7)}{R_1 + R_4 + R_7} + \frac{R_2(R_5 + R_8)}{R_2 + R_5 + R_8}}$$

It is to be noted that $V_{HH1}$ and $V_{N1N}$ may not be measureable by a T/R unit since they represent voltage measurements between more than one test point.

3) Then, T/R unit 2 applies a resistive load $R_L$ between H2 and N2 and a another set of equations may be derived:

$$V_{H1N1}^{(2)} = V_{HN}^{(2)} - V_{HH2}^{(2)} \frac{R_1}{R_1 + R_7} - V_{N2N}^{(2)} \frac{R_2}{R_2 + R_8} \text{ and}$$

$$V_{H2N2}^{(2)} = \frac{R_L V_{HN}^{(2)}}{R_L + \frac{R_4(R_1 + R_7)}{R_1 + R_4 + R_7} + \frac{R_5(R_2 + R_8)}{R_2 + R_5 + R_8}}$$

wherein the superscript "(2)" indicates that this is the second non-baseline test/response measurement.

4) The central controller is informed of the measurements $V_{HN}$, $V_{H1N1}$, $V_{H2N2}$, (both baseline and non-baseline) and characterizes the electrical distribution system by computing R1-R9 and RH and RG to the extent possible. Some of the computations it may make include, for example, assuming that the ratios $$\frac{R_4}{R_4 + R_7} = \frac{R_5}{R_5 + R_8} = \alpha$$

are equal (calling this ratio α) and then obtaining $$\alpha = \frac{V_{HN}^{(1)} - V_{H2N2}^{(1)}}{V_{HN}^{(1)} - V_{H1N1}^{(1)}}$$

The controller generally expects α to be either 0 or 1, depending on whether R7 is large (open circuit in FIG. 2A) or R4 is large (open circuit in FIG. 2B). Any value other than 0 or 1 may indicate a fault.

5) There are many similar calculations with the remaining equations that characterize the electrical distribution system. Continuing in this way, the controller identifies whether FIG. 2A or 2B applies, and computes remaining resistance values.

Figure 3:
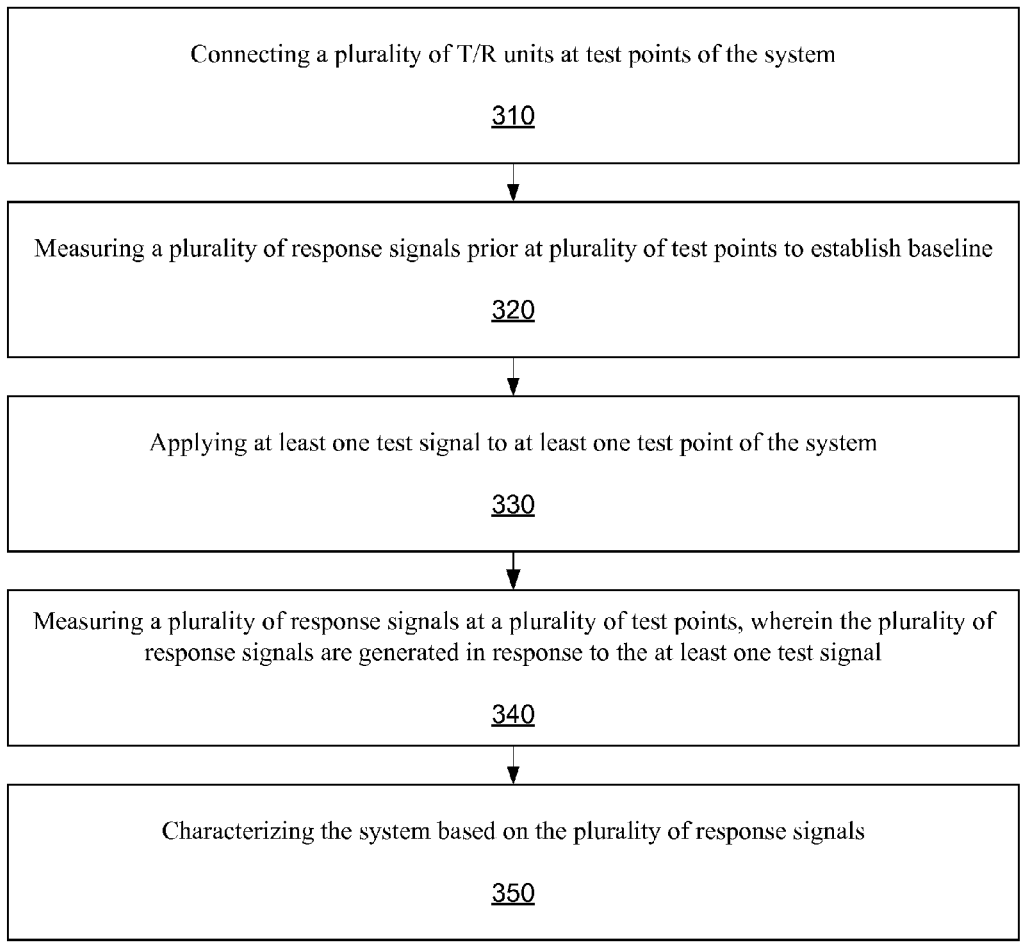
FIG. 3 is a flow chart that includes steps of an example of a method of characterizing an electrical power distribution system.

FIG. 3 is a flow chart that includes some of the steps described above as a method of characterizing an electrical power distribution system. A first step 310 includes connecting a plurality of T/R units to the test points of the electrical distribution system. A second step 320 includes measuring a plurality of response signals at a plurality of test points to establish a baseline. A third step 330 includes applying at least one test signal to at least one test point of the system. A fourth step 340 includes measuring a plurality of response signals at a plurality of test points, wherein the plurality of response signals are generated in response to the at least one test signal. A fifth step 350 includes characterizing the system based on the plurality of response signals.

An embodiment of a test point includes at least one electrical contact. An embodiment includes a test signal being applied between pairs of electrical contacts at a test point. For an embodiment, the test signal includes at least one of a resistive or reactive load or static injected current. For another embodiment, the test signal includes at least one of a time-varying resistive or reactive load, or a time-varying injected current.

For some embodiments, characterizing the electrical power distribution system based on the plurality of response signals includes deducing electrical properties of the individual branches of the electrical power distribution system. For other embodiments, characterizing the electrical power distribution system based on the plurality of response signals includes locating at least one fault within the system.

As previously described, baseline measurements can be made before application of test signals. That is, a baseline measurement at one or more test points can be established before applying the at least one test signal. The baseline measurement can be established by measuring a signal response without applying any external signals, or the baseline measurement can be established by applying a baseline signal at one or more test points.

Embodiments include one or more measurements being observed for time-variations to indicate time-varying effects. An example of a time-varying effect is due to heating that accompanies the flow of current through localized high resistance. Current drawn through a defective or corroded junction of wires having a local high-resistance contact, for example, may cause the junction to heat excessively. This heat could manifest itself as a change in the current drawn through a fixed load over time.

Embodiments include application of at least one test signal and the measurement of a plurality of response signals being coordinated according to a schedule. One embodiment of the schedule includes substantially simultaneous measurements of each of the plurality of response signals. That is, more information can be obtained by a simultaneous measurement than by both measurements made separately. For example, separate measurements at two locations might indicate a problem at each test point individually, but cannot tell whether these two problems are distinct or actually originate from one common problem. Only by simultaneous measurements can important details such as these be determined. The term "simultaneous measurements" means measurements taken substantially at the same time or within the time-constant of the system being tested. It is well-known to practitioners in the art that current digital systems often make measurements by sampling using analog-to-digital converters. Such sampling is often governed by high-frequency clocks. Sampling by two different devices, using their respective clocks, may therefore not be precisely at the same time, but considered simultaneous nevertheless for the purposes of the time-scales of the system being tested.

Other embodiments include applying one or more test signals simultaneously at distinct test points. The intention being that information can be obtained by the simultaneous application of multiple signals that cannot be obtained by the application of just one signal, even if this one signal is applied at different non-overlapping times at those same test points. In a similar fashion, information can be obtained by the simultaneous measurement at multiple test points that cannot be obtained by measuring at just one test point.

The previously mentioned scheduled can be determined by a central controller initiating the application of test signals and coordinating the measurement of the plurality of response signals. Further, embodiments include the central controller receiving the response signals and performing the characterization of the electrical power distribution system based on the plurality of response signals.

For embodiments, characterizing the electrical power distribution system based on the plurality of response signals includes generating a blue-print of the system. Embodiments include the blue-print of the electrical power distribution system being obtained, in part, by deducing the resistances of the individual branch circuits of the system. The "electrical blueprint" of the electrical distribution system can be constructed noninvasively. Such a blueprint can provide information about the various circuits contained within the structure as they originate from a centralized feed, pass through some current-limiting device such as a circuit breaker or fuse, and then are distributed throughout the structure. The blueprint provides information on which circuits are directly connected to each other and which are not. While an electrical blueprint is sometimes available when a building is new, such blueprints become obsolete as soon as the first modification to the structure is made. Being able to make such a blueprint on-demand, noninvasively, and without prior knowledge of the existing wiring, would be very desirable. The described embodiment for determining the condition of the electrical distribution system is economical to implement and can be readily automated. The controller may instruct the T/R units which test signals to apply and which response signals to measure.

Figure 4:
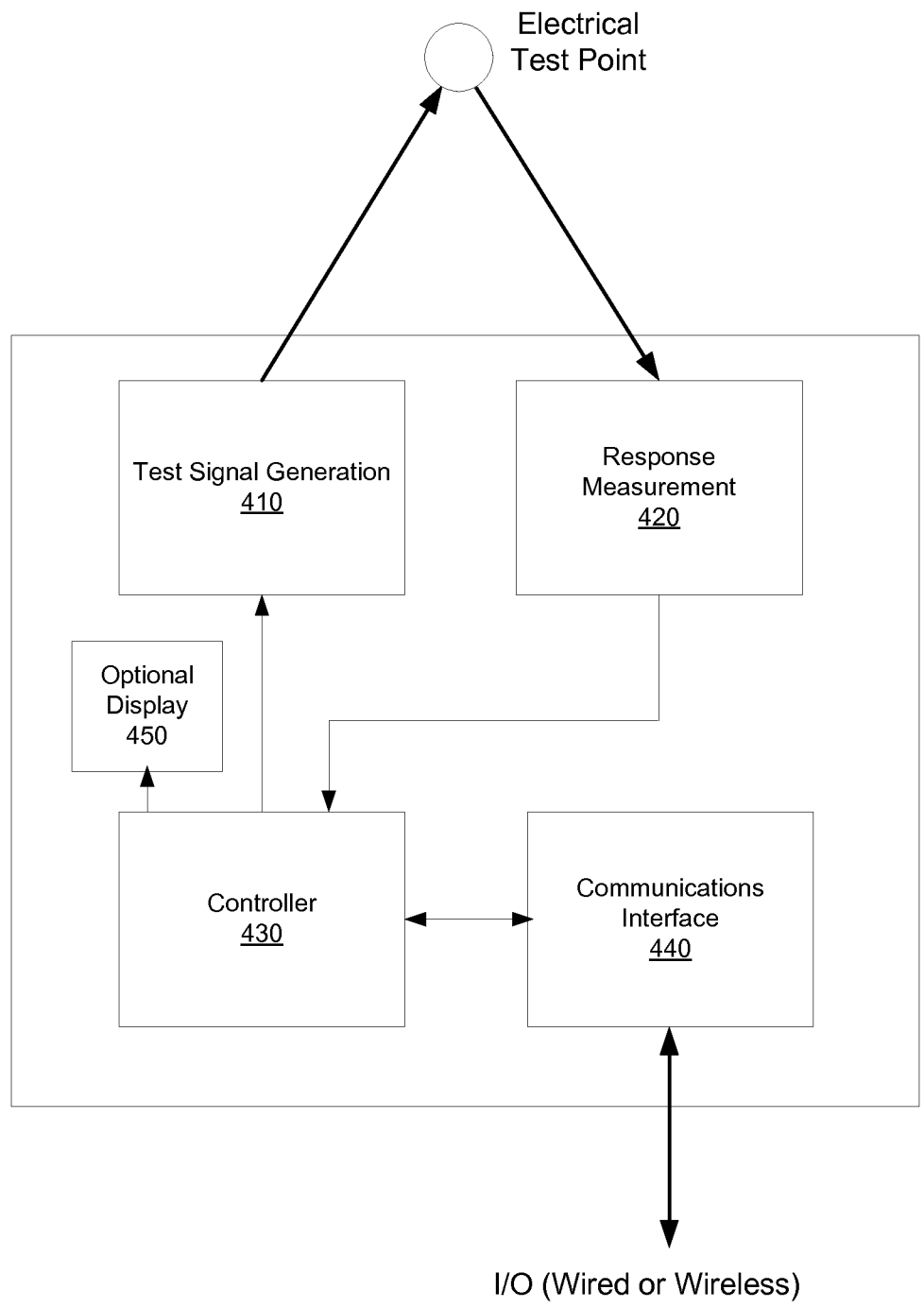
FIG. 4 shows an example of a test/response unit.

FIG. 4 shows an example of a test/response (T/R) unit 400. The unit 400 includes a controller 430. The controller 430 controls a test signal generation unit 410 that applies a passive or active signal to one or more test points. A response measurement unit 420 measures response signals at one or more test points. A communications interface 440 provides the unit 400 with the ability to communicate with other T/R units or another control unit. A display unit 450 can provide information to a user of the unit 400.

The unit 400 can characterize an electrical system that the test point shown in FIG. 4 is connected to. The unit 400 can operate alone, or in conjunction with at least one other T/R unit. The unit 400 (and optionally other units as well) apply at least one test signal to at least one test point of the electrical distribution system. The unit(s) measure a plurality of response signals at a plurality of test points, wherein the plurality of response signals are generated in response to the at least one test signal. The unit(s) can characterize the system based on the plurality of response signals.

Figure 5:
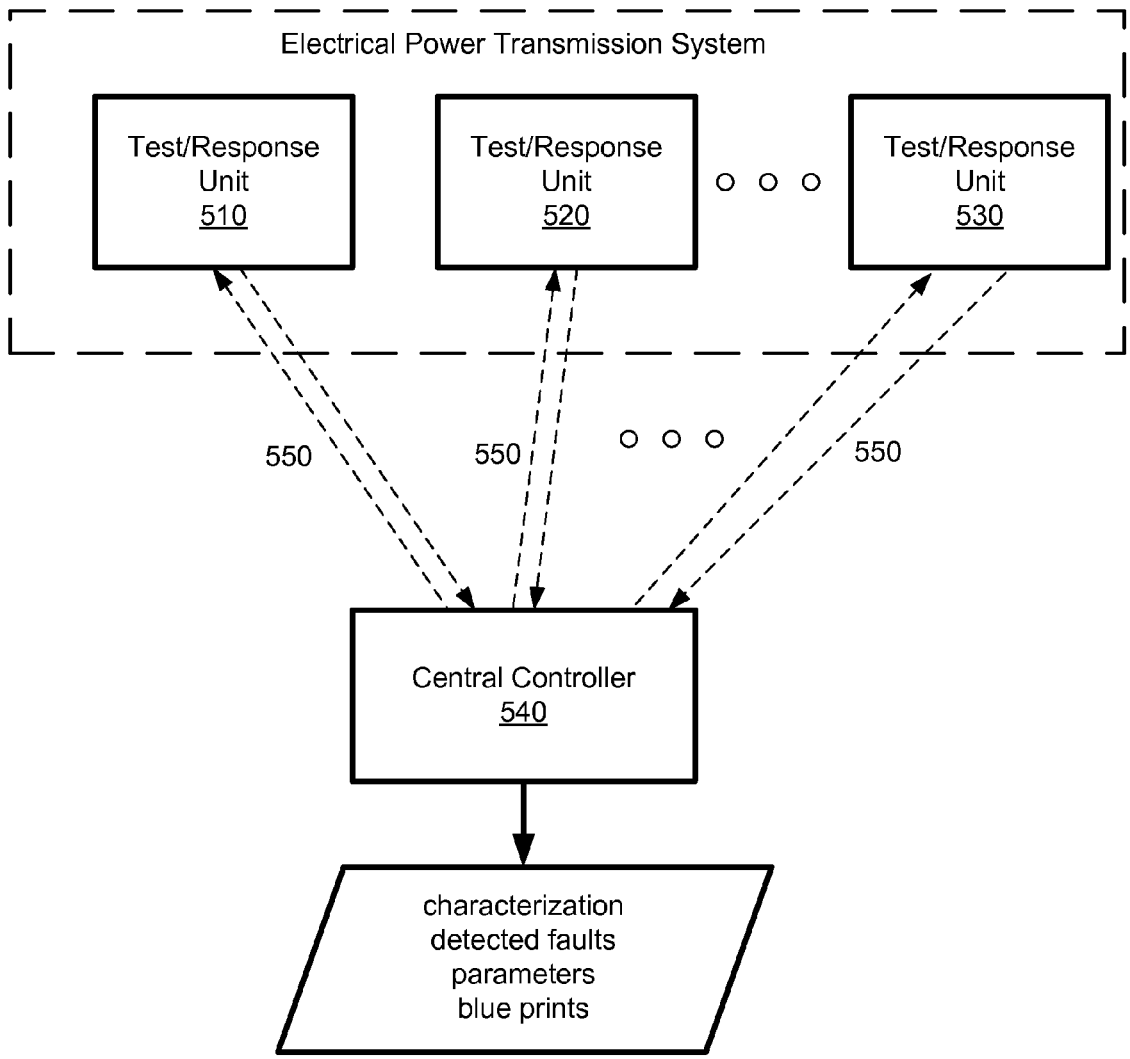
FIG. 5 shows an example of multiple test/response units and a central controller for characterizing an electrical distribution system.

FIG. 5 shows an example of multiple test/response (T/R) units 510, 520, 530 and a central controller 540 for characterizing an electrical distribution system. The T/R units 510, 520, 530 are connected to test points of the electrical power distribution system as previously described. Additionally, the T/R units 510, 520, 530 are connected to the central controller through communications channels 550. Embodiments include the controller managing the application of test signals by the T/R units 510, 520, 530, and characterizing the electrical power distribution system based on response signals measured by the T/R units 510, 520, 530.

The communications channel 550 can utilize any number of available communications link technologies. A conceptually straightforward communication channel consists of a wire which links all T/R units together and to the controllers(s). Having a common wire at each T/R unit would facilitate the measurement process by establishing a universal reference potential. However the deployment of a common wire could add to operational difficulties. Alternatively the electrical distribution system itself could constitute a communications channel using known principles and hardware. However difficulties could be experienced where a circuit is electrically isolated from the rest of the electrical distribution system, either because of an open switch, or because the circuit has been abandoned and is not energized. Still another alternative is a wireless communications channel using, for example, unlicensed spectrum. This requires a T/R unit and processor to contain a wireless transceiver. Known technologies such as Wi-Fi could be used.

FIG. 6 is a flow chart that includes steps of another example of a method of characterizing an electrical power distribution system. A step 610 includes applying a plurality of test signals (as opposed to applying a single test signal) to a plurality of test points of the system. A subsequent step 620 includes measuring a response signal at one or more test points, wherein the response signals are generated in response to the plurality of test signals. A subsequent step 630 includes characterizing the system based on the at least one response signal. As previously described, embodiments include characterizing the electrical power distribution system based on the at-least one response signal, including locating at least one fault within the system. For a specific embodiment, locating at least one fault within the electrical power distribution system includes locating high electrical resistance in the system.

Although specific embodiments have been described and illustrated, the embodiments are not to be limited to the specific forms or arrangements of parts so described and illustrated. The embodiments are limited only by the appended claims.

What is claimed:

1. A method of characterizing an electrical power distribution system, comprising:
    applying, by at least one test/response unit, at least one test signal to at least one test point of the electrical power distribution system, wherein the at least one test point is electrically connected to the electrical power distribution system and the at least one test/response unit is electrically connected to the at least one test point;
    measuring, by a plurality of test/response units, a plurality of response signals at a plurality of test points, wherein the plurality of test points are electrically connected to the electrical power distribution system and the plurality of test/response units are electrically connected to the plurality of test points, wherein the plurality of response signals are generated in response to the at least one test signal;
    communicating, by the plurality of test/response units, the plurality of response signals to at least one controller; and
    characterizing the system, by the at least one controller, based on the plurality of response signals.

2. The method of claim 1, further comprising establishing a baseline measurement at one or more test points before applying the at least one test signal.

3. The method of claim 2, wherein establishing the baseline measurement comprises measuring a signal response without applying any external signals.

4. The method of claim 1, wherein characterizing the electrical power distribution system based on the plurality of response signals includes deducing electrical properties of the individual branches of the electrical power distribution system.

5. The method of claim 1, wherein characterizing the electrical power distribution system based on the plurality of response signals comprises locating at least one fault within the system.

6. The method of claim 1, wherein one or more measurements is observed for time-variations to indicate time-varying effects.

7. The method of claim 1, wherein the at least one test signal is applied between pairs of electrical contacts at a test point.

8. The method of claim 1, wherein a test signal includes at least one of a static load or static injected current.

9. The method of claim 1, wherein the at least one test signal includes at least one of a time-varying resistive or reactive load, or a time-varying injected current.

10. The method of claim 1, wherein characterizing the electrical power distribution system based on the plurality of response signals comprises generating a blue-print of the system.

11. The method of claim 10, wherein the blue-print of the electrical power distribution system is obtained, in part, by deducing the resistances of the individual branch circuits of the system.

12. A system for characterizing an electrical power distribution system, comprising:
    a plurality of test/response units electrically attached to a plurality of test points, wherein the plurality of test points are electrically connected to the system, said units configured to, at least one of, generate test signals or measure response signals at the plurality of test points;
    at least one controller coordinating application of test signals by the plurality of test/response units to the plurality of test points, and characterizing the electrical power distribution system based on the response signals;
    communications links between the plurality of test/response units and the at least one controller, allowing the plurality of test/response units to communicate with the at least one controller.

13. The system of claim 12, wherein the system is operative to generate a blue-print of the system based on measured response signals.

14. The system of claim 13, wherein the blue-print of the electrical power distribution system is obtained, in part, by deducing the resistances of the individual branch circuits of the system.

15. The system of claim 12, wherein the system is operative to locate at least one fault within the system based on measured response signals.

16. The system of claim 12, wherein the measured response signals are used to deduce electrical properties of individual branch conductors of the electrical power distribution system.

17. A test/response unit that is connectable to an electrical power distribution system, the unit operative to:
    apply at least one test signal to at least one test point of the electrical power distribution system, wherein the at least one test point is electrically connected to the electrical power distribution system and the test/response unit is electrically connected to the at least one test point;
    measure at least one response signal at the at least one test point, wherein the at least one response signal is generated in response to the at least one test signal; and
    receive instructions on application of the test signal from, or transmit the results of its measured response signal to, another test/response unit or coordinating controller.

18. The test/response unit of claim 17, wherein a plurality of other test/response units are operative to measure a plurality of response signals at a plurality of test points, wherein the plurality of response signals are generated in response to the at least one test signal.

19. The test/response unit of claim 18, wherein the test/response unit, one of the other test/response units, or the coordinating controller, is operative to characterize the system based on at least one of: the measured at least one response signal or the plurality of response signals.

20. The test/response unit of claim 19, wherein characterizing the system includes locating at least one fault within the system.

\* \* \* \* \*